US010263815B1

(12) United States Patent
Geary et al.

(10) Patent No.: US 10,263,815 B1
(45) Date of Patent: Apr. 16, 2019

(54) CONTINUOUS TIME LINEAR EQUALIZATION

(71) Applicant: Xilinx, Inc., San Jose, CA (US)

(72) Inventors: Kevin Geary, Ballincollig (IE); Declan Carey, Douglas (IE); Mohamed Elzeftawi, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/837,928

(22) Filed: Dec. 11, 2017

(51) Int. Cl.
    *H04L 25/03* (2006.01)
    *H03G 3/30* (2006.01)
    *H03K 19/177* (2006.01)

(52) U.S. Cl.
    CPC ..... *H04L 25/03878* (2013.01); *H03G 3/3089* (2013.01); *H03G 2201/103* (2013.01); *H03K 19/1774* (2013.01)

(58) Field of Classification Search
    CPC ......... H04L 25/03006; H04L 25/03038; H04L 25/03076
    USPC .................................. 375/229–236
    See application file for complete search history.

(56) References Cited

U.S. PATENT DOCUMENTS

2008/0055005 A1* 3/2008 Nam, II .................. H03F 1/342
                                                            330/277

OTHER PUBLICATIONS

Kimura, Hiroshi et al., "A 28 Gb/s 560 mW Multi-Standard SerDes with Single-Stage Analog Front-End and 14-Tap Decision Feedback Equalizer in 28 nm CMOS," IEEE Journal of Solid-State Circuits, Dec. 2014, vol. 49, No. 12, pp. 3091-3103, IEEE, Piscataway, New Jersey, USA.
Parikh, Samir et al., "A 32 Gb/s Wireline Receiver with a Low-Frequency Equalizer, CTLE and 2-Tap DFE in 28nm CMOS," Proc. of the 2013 IEEE International Solid-State Circuits Conference, Feb. 17, 2013, pp. 28-30, IEEE, Piscataway, New Jersey, USA.
Takemoto, Takashi et al., "A 25-to-28 Gb/s High-Sensitivity (-9.7 dBm) 65 nm CMOS Optical Receiver for Board-to-Board Interconnects," IEEE Journal of Solid-State Circuits, Oct. 2014, vol. 49, No. 10. pp. 2259-2276, IEEE, Piscataway, New Jersey, USA.

* cited by examiner

*Primary Examiner* — Kevin Kim
(74) *Attorney, Agent, or Firm* — W. Eric Webostad; Adam Davenport

(57) ABSTRACT

This disclosure relates generally to continuous time linear equalization. In an example of a continuous time linear equalizer, a variable gain circuit includes transistors having gate nodes respectively as a first and a second input node. A first transimpedance circuit is connected between the first input node and a first output node. A second transimpedance circuit is connected between the second input node and a second output node. A source node of each of the first transistor and the second transistor are commonly connected to one another. In the same or another equalizer, output nodes of a first frequency peaking circuit are connected to input nodes of a second frequency peaking circuit. In such a same or another equalizer, an RC feedback circuit has tap-off nodes and summing nodes respectively connected at the output nodes of the first frequency peaking circuit.

20 Claims, 9 Drawing Sheets

US 10,263,815 B1

CONTINUOUS TIME LINEAR EQUALIZATION

TECHNICAL FIELD

The following description relates to integrated circuit devices ("ICs"). More particularly, the following description relates to continuous time linear equalization.

BACKGROUND

A conventional continuous time linear equalizer ("CTLE") is a well-known device for providing a programmable transfer function for shaping signal characteristics to compensate for frequency dependent losses in a communication channel. As data transfer rates, and thus communication channel frequencies, increase, use of CTLEs becomes more relevant to handle equalization to compensate for communication signal attenuation.

SUMMARY

An apparatus relates generally to continuous time linear equalization. In one such apparatus thereof, a continuous time linear equalizer includes a variable gain circuit. The variable gain circuit includes a first transistor and a second transistor each having a gate node respectively configured as a first input node and a second input node of the variable gain circuit. A first transimpedance circuit is connected between the first input node and a first output node of the variable gain circuit. A second transimpedance circuit is connected between the second input node and a second output node of the variable gain circuit. A source node of each of the first transistor and the second transistor are commonly connected to one another.

Another apparatus relates generally to continuous time linear equalization. In one such apparatus thereof, a continuous time linear equalizer includes a first frequency peaking circuit and a second frequency peaking circuit. Output nodes of the first frequency peaking circuit are connected to input nodes of the second frequency peaking circuit. The second frequency peaking circuit includes: a voltage-to-current converter having the input nodes, and a resistor-capacitor ("RC") feedback circuit. The RC feedback circuit is configured to include combined tap-off and summing nodes respectively in common with the output nodes of the first frequency peaking circuit and the input nodes of the voltage-to-current converter circuit.

A method relates generally to continuous time linear equalization. In one such method thereof, a data signal is obtained from a communications channel. The data signal is equalized with a continuous time linear equalizer circuit. The equalizing of the data signal with the continuous time linear equalizer circuit includes: providing first frequency peaking for first frequencies of the data signal; providing second frequency peaking for second frequencies of the data signal higher than, lower than or equal to the first frequencies; and providing variable gain control of the data signal. The providing of the variable gain control includes feeding back output of a variable gain control circuit back through impedance circuits to an input of a gain circuit to provide a transimpedance amplifier-like function. An equalized version of the data signal is output from the continuous time linear equalizer circuit.

Other features will be recognized from consideration of the Detailed Description and Claims, which follow.

BRIEF DESCRIPTION OF THE DRAWINGS

Accompanying drawings show exemplary apparatus (es) and/or method (s). However, the accompanying drawings should not be taken to limit the scope of the claims, but are for explanation and understanding only.

DETAILED DESCRIPTION

Figure 1:
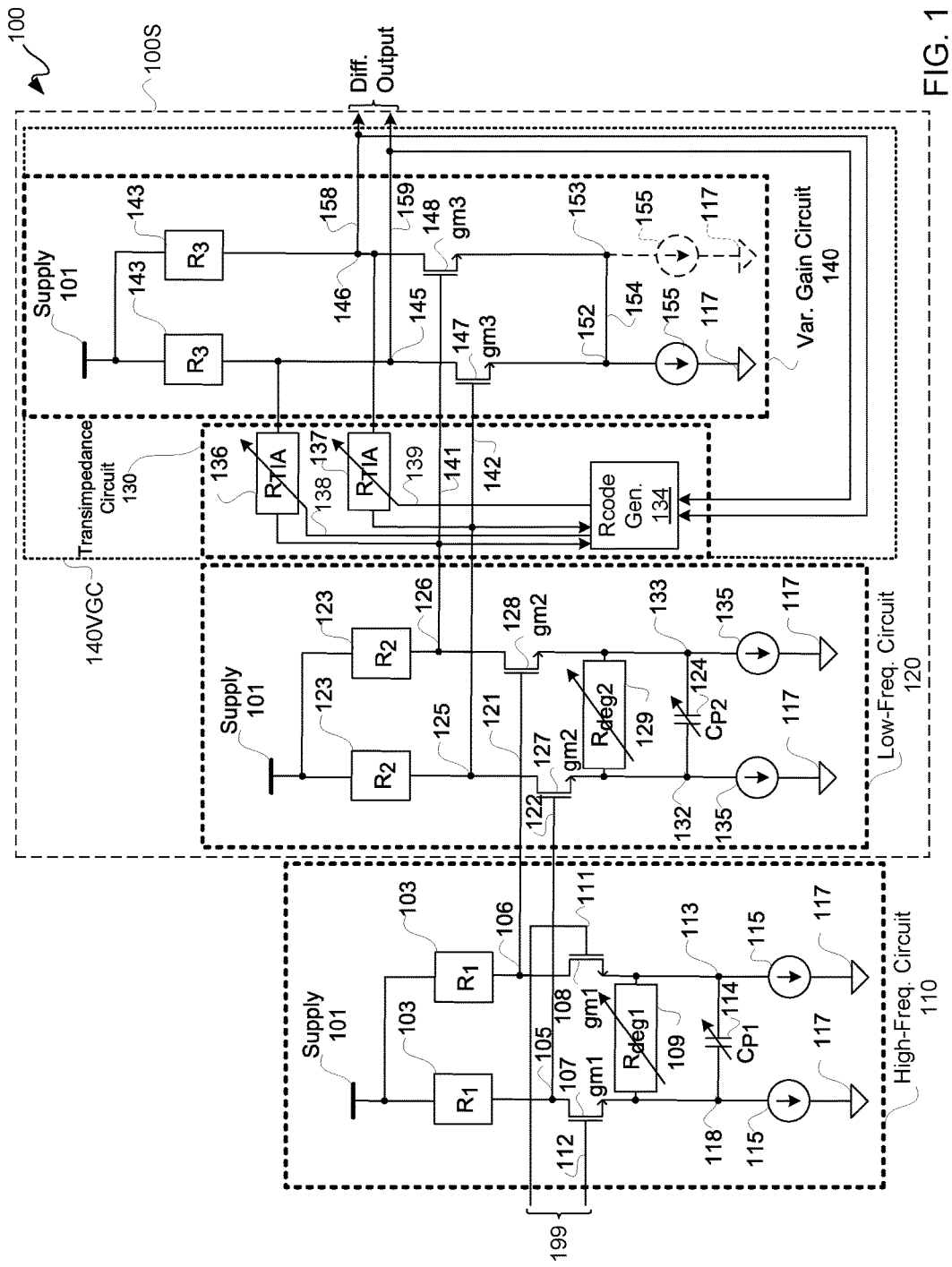
FIG. 1 is a schematic diagram depicting an exemplary equalizer.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus (es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

Signal attenuation over a communication channel may for example be up to 35 dB at the Nyquist frequency, and so conventionally a CTLE is used in a receiver coupled to such a communication channel in order to both equalize a signal for frequency dependent attenuation and control signal amplitude. In some instances, a control loop is placed around such a CTLE to control its gain. Such a loop may be described as automatic gain control ("AGC"). Moreover, a conventional continuous time linear equalizer ("CTLE") may include adjustable or fixed low-pass filtering capacitors on the output of a variable gain circuit to filter gain peaking due to use of a degeneration resistance in such a variable gain circuit.

As described below in additional detail, rather than a variable gain control circuit using a degeneration resistance across source nodes of a differential pair, such source nodes are shorted to one another and a differential feedback resistance is added to provide a transimpedance amplifier-like ("TIA-like") function for a variable gain function for a variable gain circuit of a CTLE. Gain of such a variable gain circuit may vary directly with amount of resistance in such feedback resistance, where larger resistances provide larger gains and vice versa. Additionally, because of such feedback path, gain at an output of an immediately preceding low-frequency peaking circuit to a variable gain circuit of a CTLE and gain of an output of such a variable gain circuit in combination with gain from such feedback resistance may be looked at together to determine an overall gain.

Moreover, because a source connected degenerative resistance is eliminated in a variable gain circuit of a CTLE, gain peaking in such a TIA-style variable gain circuit may likewise be reduced with removal of such a degenerative resistance. Use of degeneration resistors to implement variable gain results in the presence of an inevitable and potentially unwanted parasitic zero resulting from the circuit implementation of the current source conventionally found at the degeneration node. Such a parasitic zero may increase the equalization function of a stage by producing a gain at high frequency which may be higher than the DC gain of the stage. Using TIA style feedback resistors, with a common shorted node instead of degeneration, means that capacitors previously used on an output of such variable gain circuit, may be eliminated, as there is no longer any gain peaking to be filtered from such variable gain circuit output. Such gain peaking, may be reduced for a range of values from a minimum to a maximum gain control code at high frequencies, namely at frequencies at or above a Nyquist frequency or a bandwidth of such a variable gain circuit. In addition to a variable gain function provided through TIA-like connected feedback adjustable resistance circuits, low-frequency gain boosting may be provided.

Another enhancement to a CTLE, which may be used with or without TIA-like connected feedback adjustable resistance circuits, is addition of a resistor-capacitor ("an RC") feedback path or RC feedback loop. This addition allows for elimination of degeneration resistors and capacitors in a conventional peaking CTLE circuit in favor in part of low-pass filters in such an RC feedback path. Such eliminated passive components of resistors and capacitors in a conventional peaking CTLE circuit can be substantially larger than components added by addition of an RC feedback path. This allows for a more efficient layout of a CTLE, as well as a less power consuming CTLE.

Another enhancement to a CTLE, which may be used with or without TIA-like connected feedback adjustable resistance circuits and may be used with an RC feedback path, is common-mode control of a CTLE circuit. This addition is to hold output common-mode of such a peaking CTLE circuit more constant than without such common-mode control.

In application terms, a CTLE as described herein may be used in any receiver application where equalization is used. With the above general understanding borne in mind, various configurations for a CTLE are generally described below.

FIG. 1 is a schematic diagram depicting an exemplary CTLE 100. CTLE 100 includes a high-frequency peaking CTLE circuit ("high-frequency circuit") 110, a low-frequency peaking CTLE circuit ("low-frequency circuit") 120, an impedance network feedback circuit ("transimpedance circuit") 130, and a variable gain control circuit ("gain circuit") 140. Gain circuit 140 is configured as a current-mode logic ("CML") buffer. Generally, high-frequency circuit 110 may be thought of as a first stage of CTLE 100, and circuits 120, 130 and 140 in combination may be thought of as a second frequency peaking stage of CTLE 100, namely generally indicated as CTLE 100S. As noted previously and subsequently, the attachment of the terms "high-frequency" and "low-frequency" to CTLE 110 and CTLE 120, respectively, does not exclude any configuration where the equalization of CTLE 110 may occur at a frequency above or below or at the same frequency as that of CTLE 120. It also does not exclude configurations where the output bandwidth of CTLE 110 may be above or below or the same as CTLE 120. Moreover, transimpedance circuit 130 and gain circuit 140 may be considered part of a variable gain control circuit 140VGC, though circuits 130 and 140 are parsed out herein for purposes of clarity and not limitation.

High-frequency circuit 110 and low-frequency circuit 120 are high-frequency and low-frequency peaking circuits, respectively, as each gets a "zero" in its input-output signal transfer function at $1/(2*\pi*Rdeg*Cp)$, where a degenerative resistance value Rdeg and a degenerative capacitance value Cp determine high and low degeneration-zero frequencies for circuits 110 and 120, respectively. It should be appreciated that for a low degeneration-zero frequency for low-frequency circuit 120, passive components associated with a degenerative resistance value Rdeg and a capacitance value Cp may be significantly larger than corresponding components in high-frequency circuit 110 for a high degeneration-zero frequency.

In this example, each of circuits 110, 120, and 140 is coupled between a supply bus or node 101 and a ground bus or node 117. However, in another example implementation, one or more separate or isolated grounds and/or supplies may be used. Moreover, in this example implementation, NMOS transistors are illustratively depicted; however, in another implementation PMOS transistors may be used instead of NMOS transistors depending on a common-mode voltage.

In the example CTLE 100 of FIG. 1, load resistor circuits 103, 123, and 143 may each include fixed resistors. However, in another implementation, one or more of load resistor circuits 103 or 123 may include programmable adjustable resistors and/or fixed resistors. Furthermore, other types of loads may be used. For example, one or more of load resistor circuits 103, 123, and 143 may be configured as a fixed or adjustable shunt-peaking inductance and resistive load. In yet another example, one or more of load resistor circuits 103, 123, and 143 may be an active-inductor-based load.

High-frequency circuit 110 includes a pair of impedance circuits ("resistor circuits"; "R1") 103 connected to supply bus 101, with one of such resistor circuits 103 connected to output node 105 of high-frequency circuit 110, and the other of such resistor circuits 103 connected to output node 106 of high-frequency circuit 110. High-frequency circuit 110 further includes a first input transistor 107, a second input transistor 108, a variable degeneration resistance circuit ("Rdeg1") 109, an adjustable capacitor circuit ("Cp1") 114, and a pair of current source circuits 115.

A gate node of transistor 107 is connected to receive an input signal 112, and a gate node of transistor 108 is connected to receive an input signal 111. Input signals 111 and 112 may be for a differential input data signal output of a communications channel 199, and transistors 107 and 108 may be coupled as a differential pair of transistors. Output node 105 is a drain node of transistor 107, and output node 106 is a drain node of transistor 108. Generally, gain of transistors 107 and 108 is the same, namely a gain of gm1 for each, which value may vary from implementation-to-implementation.

A differential input provided as input signals 111 and 112 may thus be input to high-frequency circuit 110. Such differential input may be from a communication channel, and thus may represent data of an input signal to be equalized by CTLE 100.

Variable degeneration resistance circuit 109 and adjustable capacitor circuit 114 are respectively connected between source nodes 118 and 113 respectively of transistors 107 and 108. Variable degeneration resistance circuit 109 may be implemented as a variable degeneration resistor array circuit A resistance adjustment control signal provided to variable degeneration resistance circuit 109 may be a code for switching transistors into substantially conductive states ("ON") or substantially non-conductive states ("OFF") for adjusting resistance, as is known. Likewise, a capacitance adjustment control signal provided to adjustable capacitor circuit 114 may be a code for switching transistors into substantially conductive states or substantially non-conductive states for adjusting capacitance, as is known. Moreover, circuitry for generation of control signals for respectively adjusting resistance of variable degeneration resistance circuit 109 and capacitance of adjustable capacitor circuit 114 is well known and thus such control circuitry and control signals are not described herein for purposes of clarity and not limitation. In this example, high-frequency circuit 110 is configured for "high" frequency peaking by adjusting resistance of variable degeneration resistance circuit 109 and/or capacitance of adjustable capacitor circuit 114.

One of current source circuits 115 is connected between source node 118 and ground bus 117, and another of current source circuits 115 is connected between source node 113 and ground bus 117. Current source circuits 115 may be implemented with transistors as is well-known. In this example, current source circuits 115 are evenly divided for a current of $0.5*I_1$ flowing through each current source 115.

Output nodes 105 and 106 of high-frequency circuit 110 may be used to provide a differential output to low-frequency circuit 120. Along those lines, output nodes 105 and 106 of high-frequency circuit 110 are input nodes 105 and 106, respectively, of low-frequency circuit 120.

Low-frequency circuit 120 includes a pair of resistor circuits ("R2") 123 connected to supply bus 101, with one of such resistor circuits 123 connected to output node 125 of low-frequency circuit 120, and the other of such resistor circuits 123 connected to output node 126 of low-frequency circuit 120. Low-frequency circuit 120 further includes a first input transistor 127, a second input transistor 128, a variable degeneration resistance circuit ("Rdeg2") 129, an adjustable degeneration capacitor circuit ("Cp2") 124, and a pair of current source circuits 135.

A gate node of transistor 127 is connected to receive an input signal 122 via output/input node 105, and a gate node of transistor 128 is connected to receive an input signal 121 via output/input node 106. Input signals 121 and 122 may be for a differential output/input, and transistors 127 and 128 may be coupled as a differential pair of transistors. Generally, gain of transistors 127 and 128 is the same, namely a gain of gm2 for each, which value may vary from implementation-to-implementation. Output node 125 is a drain node of transistor 127, and output node 126 is a drain node of transistor 128.

A differential input provided as input signals 121 and 122 may thus be input to low-frequency circuit 120. Such differential input may be from a communication channel or high-frequency circuit 110, and thus such differential input may represent data of an input signal in the process of being or to be equalized by CTLE 100. In other words, order of circuits 110 and 120 may be reversed in another implementation.

Variable degeneration resistance circuit 129 and adjustable capacitor circuit 124 are respectively connected between source nodes 132 and 133 respectively of transistors 127 and 128. Variable degeneration resistance circuit 129 may be implemented as a variable degeneration resistor array circuit.

A resistance adjustment control signal provided to variable degeneration resistance circuit 129 may be a code for switching transistors into substantially conductive states ("ON") or substantially non-conductive states ("OFF") for adjusting resistance, as is known. Likewise, a capacitance adjustment control signal provided to adjustable capacitor circuit 124 may be a code for switching transistors into substantially conductive states or substantially non-conductive states for adjusting capacitance, as is known. Moreover, circuitry for generation of control signals for respectively adjusting resistance of variable degeneration resistance circuit 129 and capacitance of adjustable capacitor circuit 124 is well known and thus such control circuitry and control signals are not described herein for purposes of clarity and not limitation.

In this example, low-frequency circuit 120 is configured for "low" frequency peaking by adjusting resistance of variable degeneration resistance circuit 129 and/or capacitance of adjustable capacitor circuit 124. Accordingly, by "low" frequency peaking, it is generally meant equalization of losses in a low frequency domain, possibly less than the Nyquist rate for a given communication protocol One of current source circuits 135 is connected between source node 132 and ground bus 117, and another of current source circuits 135 is connected between source node 133 and ground bus 117. Current source circuits 135 may be implemented with transistors as is well-known. In this example, current source circuits 135 are evenly divided for a current of $0.5*I_2$ flowing through each current source 135.

Output nodes 125 and 126 of low-frequency circuit 120 may be used to provide a differential output to gain circuit 140. Along those lines, output nodes 125 and 126 of low-frequency circuit 120 are input nodes 125 and 126, respectively, of gain circuit 140.

Gain circuit 140 includes a pair of resistor circuits ("R3") 143 connected to supply bus 101, with one of such resistor circuits 143 connected to output node 145 of gain circuit 140, and the other of such resistor circuits 143 connected to output node 146 of gain circuit 140. Gain circuit 140 further includes a first input transistor 147, a second input transistor 148, and a pair of current source circuits 155. However, in contrast to a conventional third circuit of a CTLE, which would include a variable degeneration resistance circuit ("Rdeg3") connected between source nodes of transistors 147 and 148. In CTLE 100, source nodes 152 and 153 respectively of transistors 147 and 148 are commonly coupled to one another as generally indicated with a short circuit 154. Along those lines, source nodes 152 and 153 may be considered to be a same or one common node, as described below in additional detail. Moreover, in a conventional CTLE's variable gain circuit, a variable degeneration resistance circuit may be implemented with a variable degeneration resistor array to adjust the CTLE's net gain.

A gate node of transistor 147 is connected to receive an input signal 142 via output/input node 125, and a gate node of transistor 148 is connected to receive an input signal 141 via output/input node 126. Input signals 141 and 142 may be for a differential output/input, and transistors 147 and 148 may be coupled as a differential pair of transistors. Generally, gain of transistors 147 and 148 is the same, namely a gain of gm3 for each, which value may vary from implementation-to-implementation. Output node 145 is a drain node of transistor 147, and output node 146 is a drain node of transistor 148.

A differential input provided as input signals 141 and 142 may thus be input to gain circuit 140. Such differential input may be from a high-frequency circuit 110 or a low-frequency circuit 120, and thus differential input may represent data of an input signal in the process of being equalized by CTLE 100. In other words, order of circuits 110 and 120 may be reversed in another implementation. For example, valid order combinations of circuits may in shorthand be circuits 110/120/130/140, 120/130/140/110, 120/110/130/140, or 110/130/140/120. Either of circuits 120 or 110 may precede the combination of circuits 130/140, with the other either preceding the first or placed after gain circuit 140.

One of current source circuits 155 is connected between source node 152 and ground bus 117, and another of current source circuits 155 is connected between source node 153 and ground bus 117. In this example, current source circuits 155 are evenly divided for a current of $0.5*I_3$ flowing through each current source circuits 155. Current source circuits 155 may be implemented with transistors as is well-known. However, because a common source node is used, one of current source circuits 155 may be omitted or is optional, as generally indicated with dashed lines. Along those lines, a single current source 155 may be used to have a current of $I_3$ flowing through such single current source 155.

Additionally, in contrast to a conventional CTLE, no low-pass capacitive filters need be respectively coupled to output nodes 145 and 146. Rather, a differential output provided by output signals 158 and 159 may have reduced gain peaking, such as to avoid connecting a capacitor between output node 145 and ground bus 117 and another capacitor between output node 146 and ground bus 117. A differential output provided by output signals 158 and 159 may be sourced from output nodes 145 and 146 and may be provided to the next stage (not shown). In addition to area savings, as such output capacitors consume a significant amount of IC die area, capacitive loading associated with such output capacitors may be avoided which facilitates driving a differential output signal at a lower power level.

In addition to a common source configuration for gain circuit 140, a transimpedance circuit 130 is added. Transimpedance circuit 130 may include an adjustable impedance circuit ("resistor circuit") 136 and an adjustable impedance circuit ("resistor circuit") 137, as well as resistance code ("Rcode") generator 134. Adjustable resistor circuits 136 and 137 may be implemented as respective resistance circuits, in contrast to variable degeneration resistance circuits. Adjustable resistor circuits 136 and 137 may provide respective feedback transimpedances, and accordingly contextually may be considered respective transimpedance circuits 136 and 137.

Adjustable resistor circuit 136 may be connected between output node 145 and input node 126, and adjustable resistor circuit 137 may be connected between output node 146 and input node 125. Accordingly, adjustable resistor circuit 136 may provide a feedback path from output node 145 of gain circuit 140 to output node 126 of low-frequency circuit 120, and adjustable resistor circuit 137 may provide a separate feedback path from output node 146 of gain circuit 140 to output node 125 of low-frequency circuit 120.

A resistance adjustment control signal 138 provided to adjustable resistor circuit 136 may be a code for switching transistors into substantially conductive states ("ON") or substantially non-conductive states ("OFF") for adjusting resistance of adjustable resistor circuit 136. Likewise, a resistance adjustment control signal 139 provided to adjustable resistor circuit 137 may be a code for switching transistors into substantially conductive states or substantially non-conductive states for adjusting resistance of adjustable resistor circuit 137. Such resistance adjustment controls and similar controls in this system may also use continuous control.

Resistance code ("Rcode") generator 134 may be coupled to receive input signals 141 and 142 and to receive output signals 158 and 159. Resistance code generator 134 may be configured to compare input signals 141 and 142 to output signals 158 and 159 to determine differences, and from such differences, resistance code generator 134 may select Rcodes from stored Rcodes therein to provide as resistance adjustment control signals 138 and 139.

Circuitry for resistance code generator 134 for generation of control signals 138 and 139 for respectively adjusting resistances of adjustable resistor circuits 136 and 137 may be the same as conventional control circuitry for adjusting resistance of a variable degeneration resistor array ("Rdeg3") connected between source nodes of transistors 147 and 148 in a conventional variable gain control circuit of a CTLE. Thus such control circuitry and control signals are not described herein in unnecessary detail for purposes of clarity and not limitation.

Gain circuit 140, together with transimpedance circuit 130, forms part of a variable gain circuit, where a gain may be varied by adjusting one or more of the resistances of adjustable resistor circuits 136 and/or 137. A common source gain circuit 140 with feedback path adjustable resistor circuits 136 and 137 has an ability of providing a larger gain than a variable gain control circuit of a conventional CTLE. Resistor circuits 136 and 137 coupled for feedback as described herein provide a transimpedance amplifier-like for providing a variable gain function.

A significant disadvantage of a resistively degenerated variable gain circuit of a conventional CTLE is that at low-gain settings/codes, significant gain peaking can be observed in an AC frequency response thereof. A variable gain circuit of a conventional CTLE generally uses a variable degenerated resistance circuit between source nodes of a differential pair of transistors. Size and complexity of a degenerated resistance circuit depends on the gain range of the variable gain circuit. A variable gain circuit having wide gain range can result in significant parasitic capacitances on sources of such differential pair of transistors of a CTLE variable gain circuit. With this conventional configuration, a problem is seen at low variable gain codes, namely larger values of Rdeg3 in a range of a variable degeneration resistance circuit, where unwanted peaking is seen in a conventional CTLE's AC frequency response due to such parasitic capacitance, namely "gain peaking".

To reduce such unwanted gain peaking, some filtering, such as capacitance, was added onto a conventional CTLE's variable gain circuit output. Some disadvantages of adding such output filtering are an increase in die area used due to addition of filtering capacitors and an increase in power consumption as a conventionally configured CTLE has to drive this extra filtering capacitance, namely additional capacitive load, in addition to the load of such conventional CTLE.

However, rather than having a variable gain function/control through a variable degeneration resistance circuit coupled between source nodes as in a conventional CTLE variable gain circuit, transimpedance amplifier-like resistance ("$R_{TIA}$") is provided by adjustable resistor circuits 136 and 137 to provide transimpedance amplifier-like ("TIA-like") variable gain without having to use a variable degeneration resistance circuit coupled between source nodes of a differential pair of transistors as in a conventional CTLE variable gain circuit.

By removing a variable degeneration resistance circuit, controlled access to a voltage gain node (i.e., source nodes of a differential pair in a conventional CTLE variable gain circuit) is removed in favor in part of shorting source nodes of a differential pair in a CTLE variable gain circuit. By shorting sources or source nodes of a differential pair of transistors 147 and 148, such source node 152-153 is converted into a lower-impedance current carrying path 154 as compared to having variable degeneration resistor array between such source nodes.

For a CTLE variable gain circuit, namely gain circuit 140, a source degeneration resistance circuit is completely removed in favor of placing a variable resistance network between outputs of gain circuit 140 and low-frequency circuit 120, namely a differential feedback path between a CTLE variable gain circuit and a CTLE low-frequency peaking circuit. Adjustable resistor circuits 136 and 137 may be generally thought of as TIA resistor arrays of transimpedance circuit 130.

Advantageously, gain peaking may be eliminated with respect to source degeneration due to elimination of variable degeneration resistors coupled between source nodes of a differential pair of transistors in a conventional CTLE variable gain circuit. In particular, a variable gain circuit's gain peaking problem at low-gain codes is eliminated, as there is no source degeneration. Moreover, IC area savings using variable gain TIA resistance circuits compared to conventional degeneration resistance circuits can be quite significant. Furthermore, variable gain stages implemented in a TIA style may consume less power as compared to a conventional degeneration resistance style circuit.

Additionally, filtering capacitance on CTLE output can be avoided as gain peaking is eliminated, which means CTLE 100 can occupy less area than a conventional CTLE because no output capacitors need be used to filter gain peaking. Moreover, by not having to have capacitors for filtering gain peaking from output signals 158 and 159, elimination of high impedance nodes, namely elimination of capacitive loading at drain nodes or output nodes of transistors 147 and 148 due to added filtering capacitors, means additional power saving can be achieved.

For any or all of the above-described reasons, use of feedback via a network of TIA resistance circuits in a CTLE 100 may be more efficient in terms of area, power and/or performance than a conventional CTLE with variable degeneration resistors coupled between source nodes of a differential pair of transistors in such a conventional CTLE's variable gain circuit.

Low-frequency circuit 120 may provide low-frequency gain boosting ("LFGB") by implementing a low-frequency zero in AC frequency response, namely in a transfer function of low-frequency circuit 120. Conventionally, LFGB is provided by placing a capacitance Cp2 in parallel with a degeneration resistor Rdeg2 between source nodes 132 and 133. Location of such low-frequency zero can be set by appropriate weighting of Rdeg2 and/or Cp2, namely by adjusting variable degeneration resistance circuit 129 and adjustable capacitor circuit 124.

Generally, a variable degeneration resistance circuit 129 is programmed to set a low-frequency zero location for low-frequency circuit 120. Varying an Rdeg2 resistance value is often referred to as varying the amount of peaking in a CTLE low-frequency peaking circuit. Some programmability is conventionally added to set a Cp2 capacitance value as well, so as to alter such low-frequency zero location. A time constant Rdeg2*Cp2 used to implement such a low-frequency zero in a transfer function of low-frequency circuit 120 is conventionally a large value.

Since the DC gain of low-frequency circuit 120 can be written as being equal to gm2*R2/(1+gm2*Rdeg2*0.5), minimum and maximum values of Rdeg2 are related to the load resistance, R2, to provide minimum and maximum DC gain values. To achieve a targeted low-frequency zero, capacitance Cp2 can be large in comparison to other active portions of CTLE 100. Along those lines, a variable degeneration resistance circuit 129 and an array of an adjustable capacitor circuit 124 set to respectively obtain Rdeg2 and CP2 values may dominate the overall area of CTLE low-frequency circuit 120 for providing a low frequency boost. Arrays of variable degeneration resistance circuit 129 and an adjustable capacitor circuit 124 may occupy a significantly larger area than the combination of areas occupied by gm-pair of transistors 127 and 128, tail current sources 135 and load resistor circuits 123.

Because CTLE low-frequency circuit 120 provides LFGB by implementing a low-frequency zero in its frequency domain AC response, there is an associated cost in terms of a significant amount of IC area used to implement passive components of variable degeneration resistance circuit 129 and adjustable capacitor circuit 124 used to implement such a low-frequency zero. With finer featured semiconductor process nodes, namely smaller IC geometries, implementing low-frequency zero in a low frequency peaking CTLE circuit may become even more problematic due to having to use even more IC area for passive components of variable degeneration resistance circuit 129 and adjustable capacitor circuit 124 to provide the same functionality.

As described below in additional detail, a low-frequency peaking circuit of a CTLE may be modified and coupled with an "RC feedback circuit" to implement a low-frequency zero for a dc response but with a significantly smaller IC area footprint. Variable gain control circuit 140VGC may be used without such an "RC feedback circuit," though with some performance limitations.

Such "RC feedback circuit" for providing LFGB is a modified form of a low-frequency circuit 120 as in a conventional CTLE. However, such an "RC feedback circuit" may be used with a conventional CTLE variable gain circuit or a TIA-like variable gain circuit as in CTLE 100. Accordingly, a modified form of CTLE 100 is used in the following description to describe a CTLE low-frequency peaking circuit with an RC feedback circuit for LFGB to describe an implementation with even further overall power and/or area efficiency.

Figure 2:
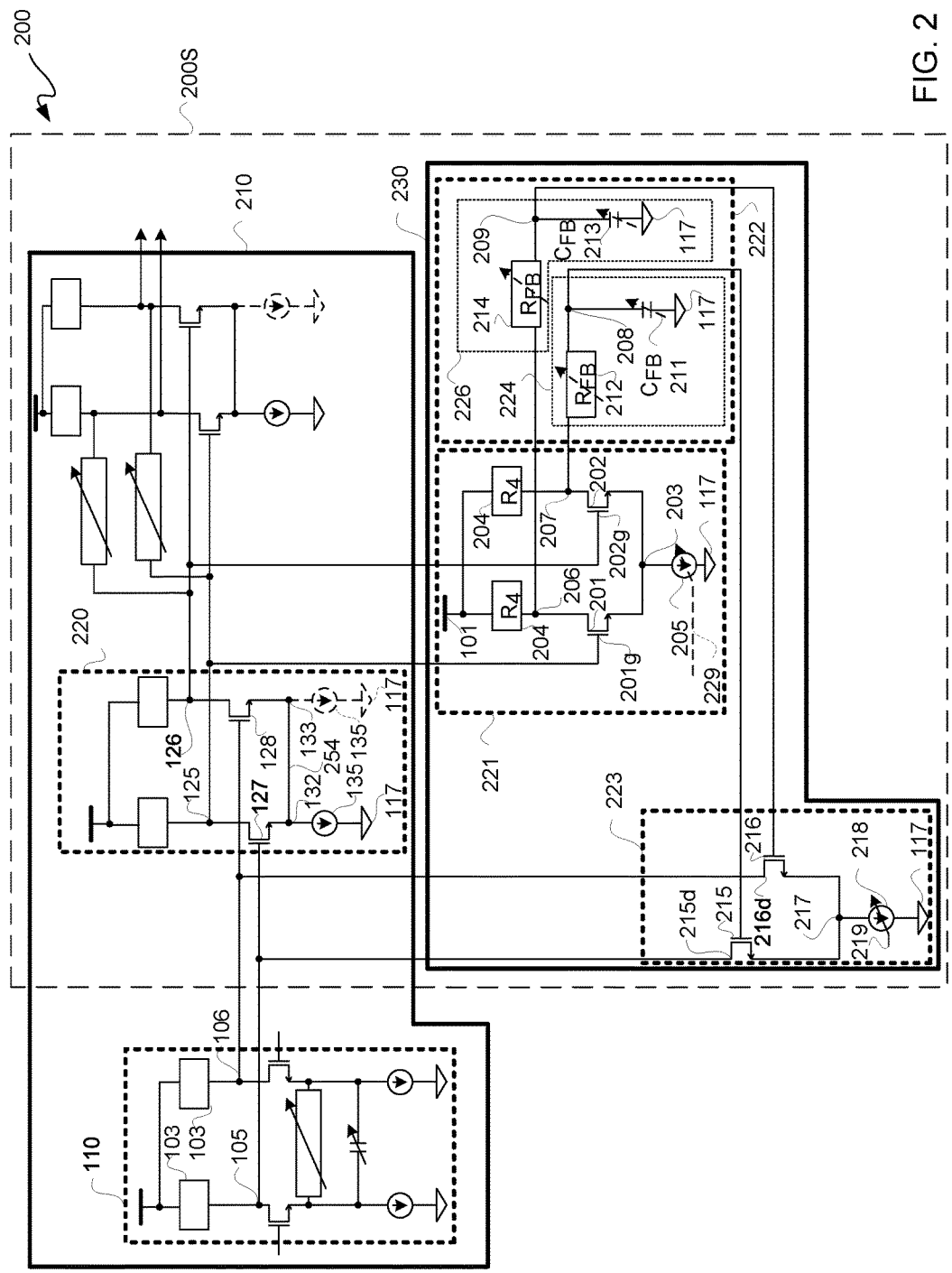
FIG. 2 is a schematic diagram depicting an exemplary equalizer with an RC feedback loop.

FIG. 2 is a schematic diagram depicting a CTLE 200. CTLE 200 includes a modified version of CTLE 100 of FIG. 1, namely CTLE 210, coupled with an RC feedback circuit 230 to provide an RC feedback loop. RC feedback circuit 230 may be used to implement an LFGB zero by insertion of a pole in a transfer function of RC feedback circuit 230.

CTLE 210 is the same as CTLE 100 of FIG. 1, except rather than a low-frequency circuit 120, a low-frequency peaking circuit ("low-frequency circuit") 220 is used. Low-frequency circuit 220 is configured as a CML buffer. Accordingly, same description is not repeated for purposes of clarity and not limitation.

In another implementation, CTLE 210 may have a conventional CTLE variable gain circuit with a source coupled variable degeneration resistance circuit, where such conventional variable gain CTLE circuit has input nodes respectively coupled to output nodes of low-frequency circuit 220. However, for purposes of clarity by way of example and not limitation, a CTLE 210 with a TIA-like variable gain circuit is further described. Circuits 220, 130, 140, and 230 in combination may be thought of as a second frequency peaking stage of CTLE 200, namely generally indicated as CTLE 200S.

Low-frequency circuit 220 is the same as previously described low-frequency circuit 120 of FIG. 1, except for the following differences. In contrast to low-frequency circuit 120, which includes a variable degeneration resistance circuit ("Rdeg2") 129 and an adjustable capacitor circuit ("Cp2") 124 connected between source nodes 132 and 133 respectively of transistors 127 and 128, in CTLE low-frequency circuit 220 source nodes 132 and 133 respectively of transistors 127 and 128 are commonly coupled to one another as generally indicated with a short circuit 254. Along those lines, source nodes 132 and 133 may be considered to be a same or one common node, as described below in additional detail. Thus, IC area used to provide variable degeneration resistance circuit ("Rdeg2") 129 and adjustable capacitor circuit ("Cp2") 124 is saved, as variable degeneration resistance circuit ("Rdeg2") 129 and adjustable capacitor circuit ("Cp2") 124 are omitted in favor of RC feedback circuit 230. This may result in significant IC area savings for a CTLE.

One of current source circuits 135 of low-frequency circuit 220 is connected between source node 132 and ground bus 117, and another of current source circuits 135 is connected between source node 133 and ground bus 117. In this example, current source circuits 135 are evenly divided for a current of $0.5*I_2$ flowing through each current source 135. Current source circuits 135 may be implemented with transistors as is well-known. However, because a common source node is used, one of current source circuits 135 may be omitted or is optional, as generally indicated with dashed lines. Along those lines, a single current source 135 may be used to have a current of $I_2$ flowing through such single current source 135.

Output nodes 125 and 126 of low-frequency circuit 220 are respectively connected to gate nodes 201g and 202g respectively of transistors 201 and 202, and output nodes 105 and 106 are respectively connected to drain nodes 215d and 216d respectively of transistors 215 and 216. Transistors 201 and 202 are part of a current-mode logic ("CML") buffer circuit 221. CML buffer circuit 221 further includes pull-up or load resistors ("R4") 204 and a current source circuit 205. Resistors 204 are connected between supply voltage bus 101 and output nodes 206 and 207, respectively.

Output nodes 206 and 207 are drain nodes of transistors 201 and 202, respectively. Source nodes of transistors 201 and 202 are commonly connected at a common source node 203. Transistors 201 and 202 may each have a gain $gm_{FB1}$.

Current source circuit 205 is connected between source node 203 and ground voltage bus 117. Current through current source circuit 205 may be $I_{FB1}$. Transistors 201 and 202 are thus coupled as a differential pair to receive a differential input via output nodes 125 and 126 and to provide a differential output via output nodes 206 and 207. In this example, current source circuit 205 is a fixed current source; however, optionally either or both of current source circuits 205 and 218 may be adjustable current sources. Current compensation may be dynamically adjusted responsive to control signal 229 provided to an adjustable current source circuit 205, which control signal 229 may be provided from for example a digital-to-analog converter ("DAC"; not shown in this figure for purposes of clarity and not limitation). Equally control signal 219 may be used to adjust current source 218 for the purpose of adjusting the gain of the feedback path.

Output nodes 206 and 207 are connected to feedback resistors 214 and 212, respectively. Other ends of feedback resistors 212 and 214 are respectively connected to filter output nodes 208 and 209. Feedback resistors 212 and 214 are on respective feedback paths and are parts of respective low-pass filters of a low-pass filter circuit 222.

Low-pass filter circuit 222 further includes feedback capacitors 211 and 213. Feedback capacitor 211 is connected between filter output node 208 and ground bus 117, and feedback capacitor 213 is connected between filter output node 209 and ground bus 117.

Feedback resistors 212 and 214 may be fixed or optionally may be adjustable. Likewise, feedback capacitors 211 and 213 may be fixed or optionally may be adjustable. Amount of IC area and consumed power saved depends on whether fixed or adjustable resistors 212 and 214 and/or whether fixed or adjustable capacitors 211 and 213 are used. For adjustable resistors 212 and 214, a control signal may be generated and used to dynamically set resistance values for adjustable resistors 212 and 214, which may be the same control signal and control circuitry used for setting a resistance of conventional variable degenerative resistor 129, and thus is not described in unnecessary detail. Likewise, for adjustable capacitors 211 and 213, a control signal may be generated and used to dynamically set capacitance values for adjustable capacitors 211 and 213, which may be the same control signal and control circuitry used for setting capacitance of a conventional adjustable capacitor 124, and thus is not described in unnecessary detail.

One low-pass RC filter 224 is formed of resistor or resistor array 212 and capacitor or capacitor array 211. Another low-pass RC filter 226 is formed of resistor or resistor array 214 and capacitor or capacitor array 213. Low-pass filter 224 has an input node 207, and low-pass filter 226 has an input node 206. Again, nodes 206 and 207 are also output nodes of CML buffer circuit 221. Filter output node 208 is an output node of low-pass filter 224, and filter output node 209 is an output node of low-pass filter 226. Accordingly, for an AC response of equalizer 200, low-frequency components of a differential output from CML buffer circuit 221 may pass through low-pass filter circuit 222 with high-frequency components thereof filtered out. A cut-off frequency may be determined by resistance value $R_{FB}$ and a capacitance value $C_{FB}$.

A filtered differential output passed out of low-pass filter circuit 222 may be provided to voltage-to-current converter circuit 223. Along those lines, voltage-to-current converter circuit 223 includes transistors 215 and 216, and an adjustable current source circuit 218. A control signal 219 may be used to set and adjust how much current to provide through current source circuit 218. In this example implementation, there is no common mode control of control signal 219.

Low-pass filter output node 208 is connected by a feedback path to a gate node of transistor 215. Low-pass filter output node 209 is connected by another feedback path to a gate node of transistor 216. It should be appreciated that additional filter structures may be used in accordance with the description herein in a similar context to shape the AC characteristics in the low-pass filter blocks, in order to equalize for specific communication channel characteristics. Transistors 201 and 202 may each have a gain $gm_{FB2}$. As previously described, drain nodes of transistors 215 and 216 are respectively connected to output nodes 105 and 106. These interconnections provide for current feedback, as described below in additional detail.

Source nodes of transistors 215 and 216 are commonly coupled at a common source node 217. Current source circuit 218 is connected between common source node 217 and ground bus 117. Current through current source circuit 218 may be $I_{FB2}$. Current through current source circuit 218 may be adjustable, and current through current source circuit 205 may be fixed, or vice versa; or both current source circuits 205 and 218 may be adjustable. However, for purposes of clarity and not limitation, it shall be assumed that current sources 205 and 218 respectively are fixed and adjustable.

In this example implementation for a TIA-like variable gain CTLE 210, tap-off points at output nodes 125 and 126 for a corresponding differential feedback branch are taken at low impedance points of TIA resistances to drive CML buffer circuit 221. CML buffer circuit 221 in turn drives a differential feedback output to passive low-pass RC filters of low-pass filter circuit 222. A low-pass filtered differential feedback output is provided to a gain circuit, namely to gates of transistors 215 and 216, of gain $gm_{FB2}$.

Transistors 215 and 216 convert a differential input voltage received from low-pass filter circuit 222 to a current differentially fed back to high-frequency circuit 110 for summing onto a load resistance, namely load resistors 103 of a high-frequency peaking high-frequency circuit 110. A zero location for such feedback may be directly proportional to the value of $1/(R_{FB}*C_{FB})$ from low-pass filters. For this implementation, passive values for $R_{FB}$ and $C_{FB}$ may be smaller than passive values for degeneration resistance Rdeg2 and capacitance CP2 of low-frequency circuit 120. This is because the components of a feedback filter may be designed independently of transconductance and load parameters of a low-frequency stage, such as provided with low-frequency circuit 120. This allows for having smaller passive components, which consume less power and less IC area than passive components for degeneration resistance Rdeg2 and capacitance CP2 of low-frequency circuit 120.

Accordingly, by adding RC feedback circuit 230 as a feedback from differential output to differential input of low-frequency circuit 220, a more efficient area footprint than low-frequency circuit 120 may be implemented by a combination of RC feedback circuit 230 and low-frequency circuit 220. Generally, RC feedback circuit 230 and low-frequency circuit 220 in combination have a significantly smaller size than a conventional CTLE low-frequency peaking circuit, because resistors 212 and 214 and capacitors 211 and 213 may be much smaller than the size of resistors and capacitors respectively in variable degeneration resistance circuit 129 and adjustable capacitor circuit 124, which passive elements dominate layout area consumption. Moreover, RC feedback circuit 230 in combination with low-frequency circuit 220 may consume less power than low-frequency circuit 120.

An LFGB zero location can be made programmable by adding programmability or adjustability to either or both $R_{FB}$ and $C_{FB}$ values. However, the amount of high-frequency peaking can be controlled by use of a current-DAC, which is represented by a control signal 219 provided to a variable current source circuit 218 for providing an adjustable current $I_{FB2}$. Generally, the higher the value of $I_{FB2}$, the greater the amount of high-frequency peaking in this configuration. However, this peaking function does not control for TIA-variable gain code changes to adjustable resistor circuits 136 and 137.

Effectively, low-frequency circuit 120 and gain circuit 140 may be reduced to respective CML buffers with TIA-like resistance coupling output of gain circuit 140 to output and input respectively of low-frequency circuit 120 and gain circuit 140. To this configuration, an RC feedback loop adds another CML buffer to drive a voltage-to-current converter with low-pass filtering between such CML buffer driver and such voltage-to-current converter. In a compact implementation, feedback resistors 212 and 214 and feedback capacitors 211 and 213 may all be fixed, and feedback current may be adjusted entirely through adjustable current source 218 for operation of a CTLE 200.

An added benefit of having eliminated a variable degeneration resistance circuit in a TIA-like variable gain circuit of a CTLE and eliminated both a variable degeneration resistance circuit and an adjustable capacitor in a low-frequency peaking circuit of such a CTLE may be derived from layout of these circuits. Because a TIA-like variable gain CTLE circuit and a variable degeneration resistance circuit-free and adjustable capacitor-free low-frequency peaking CTLE circuit do not have nearly as large a layout as in their conventional CTLE counterparts, variable gain and low-frequency peaking circuits may be positioned or laid out more closely to one another than before for improved performance. This improvement may be due to less propagation delay through CTLE between low-frequency peaking and variable gain circuits.

An RC feedback loop may be used to adjust for purposes of equalization current drive through load resistors of high-frequency circuit 110. However, because of tapping off input to an RC feedback loop at low-impedance points associated with TIA resistive feedback, a differential voltage swing at nodes 125 and 126 may be of limited use for driving transistors 201 and 202. Voltage swing at nodes 125 and 126 may be a function of a voltage gain of gain circuit 140. Additionally, altering the value of feedback resistances 136 and 137 can further affect the voltage swing at nodes 125 and 126.

Figure 3:
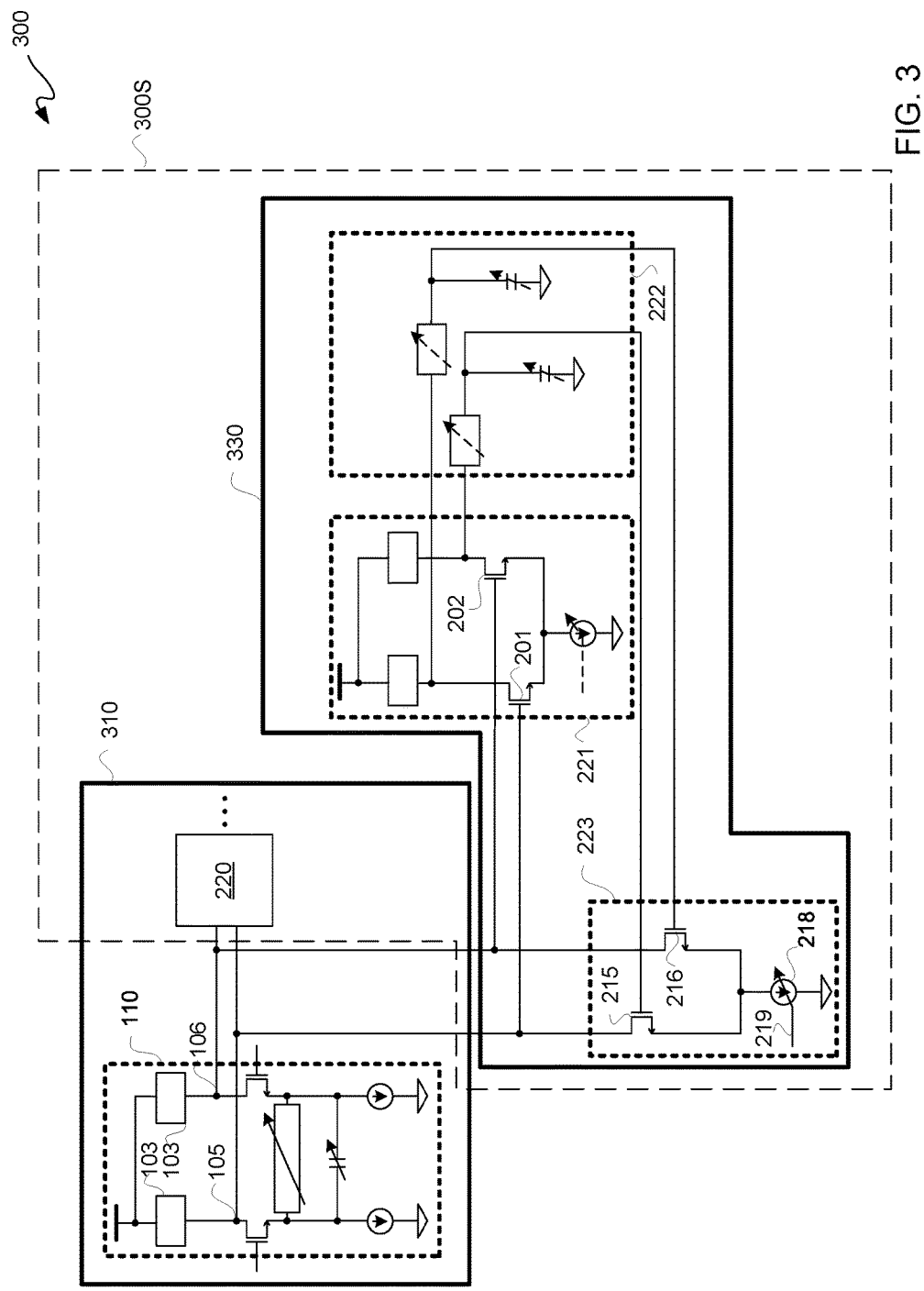
FIG. 3 is a schematic diagram depicting an exemplary equalizer with a modified RC feedback loop.

However, to mitigate against a low voltage swing at the inputs to a TIA-like stage, tap-off points or nodes 125 and 126 may be relocated to summing points or nodes 105 and 106, respectively, for a modified RC feedback loop. FIG. 3 is a schematic diagram depicting another exemplary CTLE 300 having modified taps for an RC feedback loop.

CTLE 300 includes a modified version of CTLE 210 of FIG. 2, namely CTLE 310, coupled with an RC feedback circuit 330. RC feedback circuit 330 may be used to implement an LFGB zero by insertion of a pole in a transfer function of RC feedback circuit 330, such as for frequency peaking. CTLE 300, like CTLE 200 of FIG. 2, does not include common mode control of high-frequency circuit 110. Moreover, both of CTLEs 200 and 300 may be used with a conventional degenerated CTLE variable gain circuit or a CTLE TIA-like variable gain circuit, and both of CTLEs 200 and 300 include a low-frequency circuit 220 as previously described. Circuits 220, 130, 140, and 330 in combination may be thought of as a second frequency peaking stage of CTLE 300, namely generally indicated as CTLE 300S.

CTLE 310 is the same as CTLE 210 of FIG. 2, except for the following differences. Rather than having an RC feedback differential input point taken from output of low-frequency circuit 220 as in FIG. 2, such an RC feedback differential input and output points are taken from output of high-frequency circuit 110, namely from output nodes 105 and 106. In other words, a feedback path tap-off and summing feedback tap-in are taken at the same location. In short, tapping and summing are at the same point or points.

Along those lines, output nodes 105 and 106 are respectively connected to gate nodes of transistors 201 and 202. Output nodes 105 and 106 are respectively connected to drain nodes of transistors 215 and 216. Accordingly, CTLE 310 includes combined tap-off and summing nodes 105 and 106 respectively in common with or commonly connected to output nodes of high-frequency circuit 110 and input nodes of voltage-to-current converter circuit 220. Otherwise, RC feedback circuit 330 is the same as RC feedback circuit 230 of FIG. 2.

An RC feedback differential input point taken from a differential output of high-frequency circuit 110 for connecting to CML buffer circuit 221. Such CML buffer circuit 221 in turn drives a passive RC low-pass filter circuit 222, which in turn is connected to a voltage-to-current converter circuit 223 gain-circuit for performing voltage-to-current conversion for summing back onto a load resistance, namely load resistors 103 of high-frequency peaking high-frequency circuit 110.

Configuration of CTLE 300 decouples a dependency on a TIA-variable gain code from RC feedback circuit 330 in contrast to CTLE 200 of FIG. 2. CTLE 300 can also decouple CML buffer 221 from connecting to a low impedance, low voltage swing location. Along those lines, an RC feedback loop of RC feedback circuit 330 has frequency peaking controlled by a variable current source circuit 219 for controlling current $I_{FB2}$. However, as $I_{FB2}$ current increases, voltage drop across load resistors 103 may increase. This increase in voltage drop across load resistors 103 may lead to an unwanted drop in a common-mode output of a high-frequency circuit 110. Optionally instead of or in addition to adjusting controlling current $I_{FB2}$ with control signal 219, control signal 229 may be provided to a variable current source circuit 205 to control current $I_{FB1}$.

Because of addition of an RC feedback loop, current going through load resistors of a high-frequency circuit 110 may be affected. In other words, an operating point of high-frequency circuit 110 may be otherwise affected by feedback current of an RC feedback loop. To address this effect of addition of an RC feedback loop, common mode control may be added.

A frequency peaking circuit and a variable gain circuit may be generally thought of as being in series. In this example, a first stage of such frequency peaking circuit may be provided by high-frequency circuit 110. A second stage of such frequency peaking circuit may be provided with RC feedback circuit 330 together with a voltage-to-current converter circuit 220. Along those lines, such first stage and second stage may implement first and second peaking functions, respectively. Along those lines, first frequency peaking may be implemented in degeneration of high-frequency circuit 110, and second frequency peaking may be implemented at nodes 105 and 106 directly by a local feedback loop implemented with RC feedback circuit 330 and a voltage-to-current converter circuit 220. Effectively, such second frequency peaking is moved to a feedback loop of RC feedback circuit 330, and so what was a low-frequency circuit 220 may be thought of more particularly as a voltage-to-current converter circuit 220 rather than a low-frequency peaking circuit as in FIG. 2. In a configuration with RC feedback circuit 330, voltage-to-current converter circuit 220 may in effect be used to steer current into TIA load resistors. As such, voltage-to-current converter circuit 220 is technically no longer a second frequency peaking stage by itself, but rather voltage-to-current converter interface between signal/nodes at nodes 105/106 and TIA inputs of a second frequency peaking stage. Although an example of a CML buffer voltage-to-current converter circuit 220 is used, another form of voltage-to-current converter for a current steering input to a TIA impedance may be used.

Circuits 110 and 120 have different types of outputs, namely respectively a voltage mode output and a current mode output. This explains why CTLE 200 of FIG. 2 is a less than optimal functioning system. A low-frequency circuit 220 should provide current mode output for connection to a TIA impedance, but CML buffer 221 expects a substantially voltage mode input. However, in CTLE 300, CML buffer 221 does operate as a voltage-to-voltage converter, while voltage-to-current converter circuit 220 operates as a voltage-to-current converter, which allows CTLE 300 to have better performance than CTLE 200.

Figure 4:
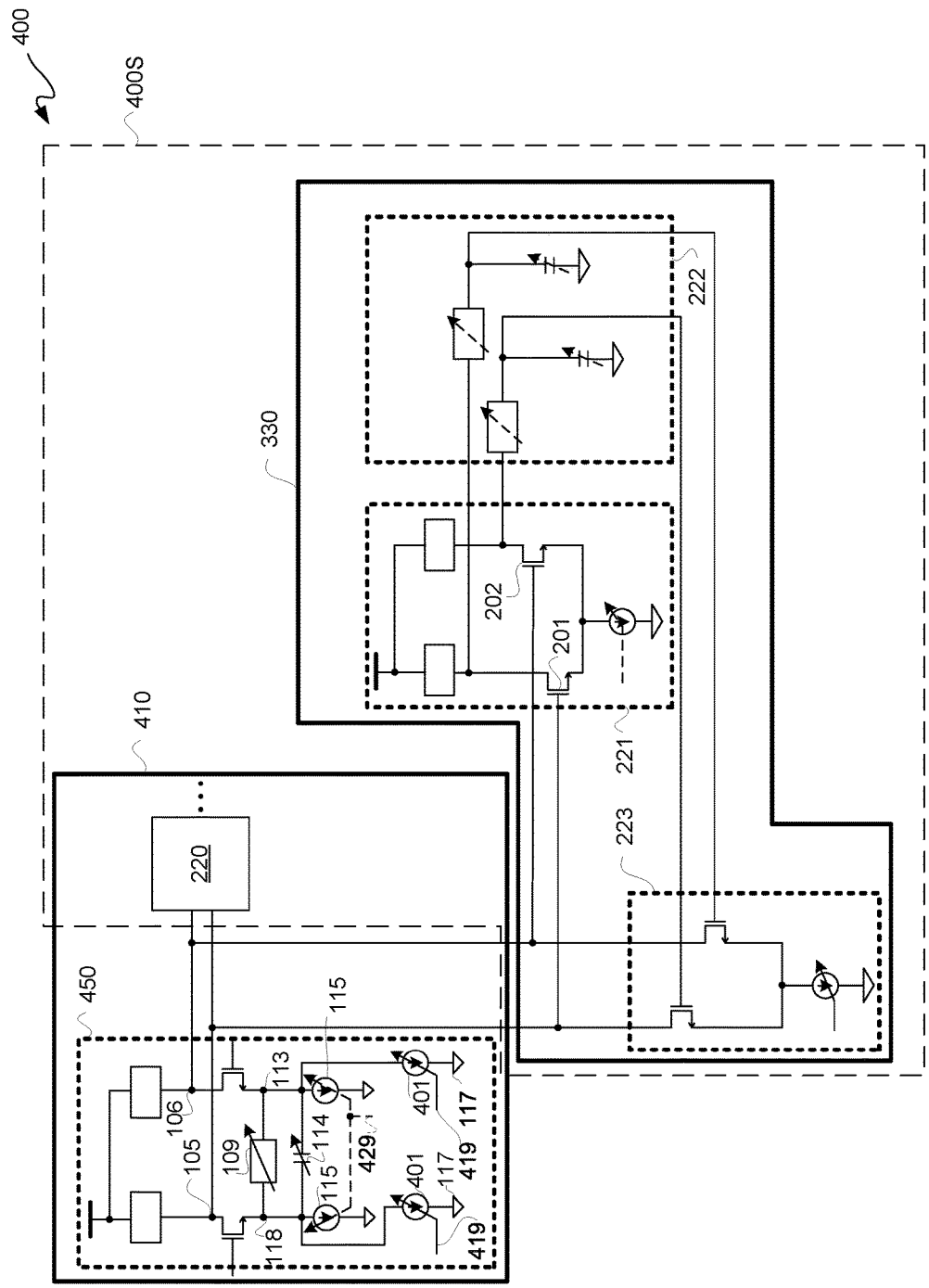
FIG. 4 is a schematic diagram depicting the exemplary equalizer of FIG. 3 with a common-mode control circuit.

FIG. 4 is a schematic diagram depicting still another exemplary CTLE 400. CTLE 400 includes a modified version of CTLE 310 of FIG. 3, namely CTLE 410, coupled with an RC feedback circuit 330. Generally, CTLE 400 is CTLE 300 of FIG. 3 with an exemplary common-mode control circuit, as described below in additional detail. Again, RC feedback circuit 330 may be used to implement an LFGB zero by insertion of a pole in a transfer function of RC feedback circuit 330. However, CTLE 400, unlike CTLE 300 of FIG. 3, includes a common mode control in a CTLE high-frequency peaking circuit ("high-frequency circuit") 450. Moreover, CTLE 400 may be used with a conventional degenerated variable gain CTLE circuit or a CTLE with a variable gain control circuit. Moreover, CTLE 400 may be implemented with a voltage-to-current converter circuit 220, as previously described. Circuits 220, 130, 140, and 330 in combination may be thought of as a second frequency peaking stage of CTLE 400, namely generally indicated as CTLE 400S.

High-frequency circuit 450 is the same as high-frequency circuit 110, except for insertion of adjustable current source circuits 401. One of current source circuits 401 is connected between source node 118 and ground bus 117, and another one of current source circuits 401 is connected between source node 113 and ground bus 117. A control signal 419, such as may be provided from a DAC, may be provided to each of adjustable current sources 401 to adjust same for common mode control, namely controlled adjustment of tail current of high-frequency circuit 450.

Optionally, in yet another implementation, addition of adjustable current source 401 may be omitted in favor of having adjustable current sources 115 directly controlled for example with a control signal 429 from a DAC. Accordingly, there are various configurations for providing adjustable current sourcing for common-mode control of a CTLE high-frequency peaking circuit, namely to hold output common-mode voltage of such CTLE high-frequency peaking circuit more constant for variations in peaking current level in a voltage-to-current converter of an RC feedback loop. In other words, common-mode control of an output voltage is used to hold a set point of a CTLE high-frequency peaking circuit more constant over variations in peaking current level in a voltage-to-current converter of an RC feedback loop.

Figure 5:
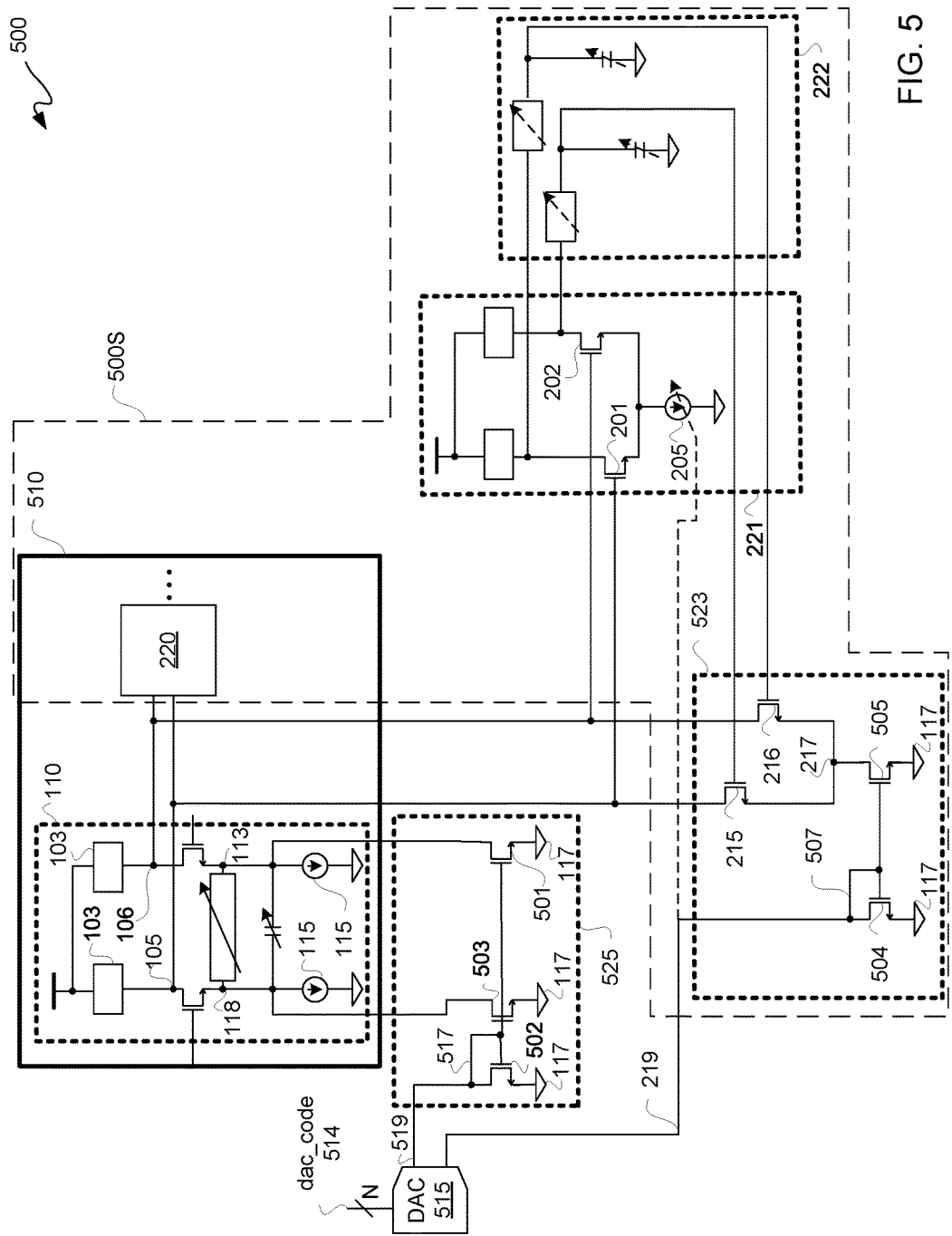
FIG. 5 is a schematic diagram depicting the exemplary equalizer of FIG. 3 with a common-mode control circuit controlled with a digital-to-analog converter.

FIG. 5 is a schematic diagram depicting an exemplary CTLE 500. CTLE 500 may be an example of CTLE 300 of FIG. 3 with a common-mode control and a DAC, or CTLE 400 of FIG. 4 with a DAC. Circuits 220, 130, 140, and 330, namely circuits 221, 222 and 523 forming circuit 330, in combination may be thought of as a second frequency peaking stage of CTLE 500, namely generally indicated as CTLE 500S.

For purposes of clarity and not limitation, a common mode control circuit 525 is illustratively depicted as being external with respect to a high-frequency circuit 110 of FIG. 1. However, common mode control circuit 525 may be internal to a high-frequency circuit 450 as in FIG. 4. Though the example of an RC feedback circuit 330 of FIG. 3 is illustratively depicted, common mode control circuit 525 may likewise be used with RC feedback circuit 230 of CTLE 200 of FIG. 2, as will be appreciated from the description herein.

CTLE 510 includes a voltage-to-current converter circuit 220 coupled following high-frequency circuit 110, as previously described. Following CML buffer version of voltage-to-current converter circuit 220 (if so configured with shorted source transistors) may be a transimpedance circuit 130 and a gain circuit 140, as previously described. However, in another implementation, following voltage-to-current converter circuit 220 may be a conventional degenerative resistance variable gain CTLE circuit. However, for purposes of clarity and not limitation, it shall be assumed that a TIA-like variable gain circuit of a CTLE is combined with an RC feedback circuit and a CML buffer voltage-to-current converter circuit to implement a low-frequency peaking function, as previously described.

A CTLE high-frequency peaking circuit, namely high-frequency circuit 110, output drives a CML buffer circuit 221. In this example, CML buffer circuit 221 has a fixed current source 205. However, as previously indicated a variable or adjustable current source 205 may be used in another implementation.

CML buffer circuit 221 in turn drives a passive RC filter circuit 222, which passive RC filter circuit 222 in turn is connected to a gain circuit of a voltage-to-current converter circuit 523. Voltage-to-current converter circuit 523 is an example implementation that may be used for voltage-to-current converter circuit 223.

Voltage-to-current converter circuit 523 is the same as voltage-to-current converter circuit 223 with a current source circuit 218 provided by transistors 504 and 505 and with control signal 219 depicted as being output from a DAC 515. DAC 515 as configured may be a current-mode DAC. A drain node of transistor 505 is connected to tail current or common source node 217, and a source node of transistor 505 is connected to ground bus 117.

Gate nodes of transistors 504 and 505 are commonly connected to one another at a control input node 507. Control input node 507 is connected to an output port of DAC 515 to receive feedback current control signal 219. Control input node 507 is further connected to a drain node of transistor 504, and a source node of transistor 504 is connected to ground bus 117. Accordingly, transistor 504 is a diode-connected transistor.

In common mode control circuit 525, each adjustable current source, such as adjustable current source 401, is implemented in this example with transistors 501-503. A drain node of each of transistors 501 and 503 is respectively connected to nodes 113 and 118, and a source node of each of transistors 501 and 503 is respectively connected to ground bus 117.

Gate nodes of transistors 501-503 are commonly connected to one another at a control input node 517. Control input node 517 is connected to another output port of DAC 515 to receive complement or inverse ("_B") feedback current control signal 519, which may be signal 419 of FIG. 4. Control input node 517 is further connected to a drain node of transistor 502, and a source node of transistor 502 is connected to ground bus 117. Accordingly, transistor 502 is a diode-connected transistor.

In this example, DAC 515 is an N-bit PMOS current DAC coupled to receive an N-bit DAC encoded ("dac_code") signal 514. DAC 515 in response to encoded signal 514 is configured to provide a feedback current control signal 219, which is for providing current $I_{FB2}$ with current control signal 219. Further in response to encoded signal 514, DAC 515 is configured to provide a complement signal to current control signal 219, namely common mode or complement feedback current control signal 519. Current $I_{FB2\_B}$ is provided with current control signal 519 as a complement or inversely related current to current $I_{FB2}$ provided with current control signal 219. In this implementation, with increasing values of encoded signal 514, current $I_{FB2}$ increases and current decreases $I_{FB2\_B}$, and vice versa. It should be appreciated that circuit elements, such as transistors 502, 503 and 501 depicted herein, describe a circuit commonly termed a "current mirror", and this description does not limit the implementation of such a current mirror to that described herein. Likewise, it should be appreciated that circuit elements, such as transistors 504 and 505 depicted herein, describe a circuit commonly termed a "current source", and this description should not limit the implementation of such a current source to that described herein. Indeed a common mode control circuit is likewise not limited to connection at nodes 118 and 113 as shown. These non-limiting circuit examples are for purposes of clarity; however, it should be understood that these and/or other types of these circuits may be used in other implementations.

The low-frequency and high-frequency peaking characteristics are influenced by control signals 219 and 519, respectively, output from DAC 515 responsive to encoded signal 514. Again, DAC 515 directly generates currents $I_{FB2}$ and $I_{FB2\_B}$ respectively with control signals 219 and 519. Generally, a current $I_{FB2}$ flows across a channel of transistor 504, and a current $2*I_{FB2}$ (not to the exclusion of other multipliers) flows across a channel of transistor 505. Likewise, generally a current $I_{FB2\_B}$ flows across a channel of each of transistors 501-503.

A DAC, such as DAC 515, may be less quantized, namely more granular, than a degeneration resistor and/or capacitor array. Along those lines, granularity, as well as range, for peaking and/or gain adjustment may be greater with use of a DAC. Accordingly, a DAC may provide for a more scalable implementation A functional change to high-frequency circuit 110 also occurs. Current source circuits 115 are still evenly divided for a current of $0.5*I_1$ flowing through each current source 115. However, total current flowing through each current source circuit 115 is reduced by current $I_{FB2\_B}$. In other words, a current of $0.5*I_1-I_{FB2\_B}$ flows through each current source 115.

Generally for higher values of current $I_{FB2}$, low-frequency and high-frequency peaking increases in this example configuration in FIG. 5. Along those lines, current $I_{FB2}$ can be referred to as a peaking current.

As current $I_{FB2}$ varies, IR drop across load resistors 103 in high-frequency circuit 110 likewise varies. However, in contrast to an implementation without common mode control, common mode control circuit 525 compensates for such variation in voltage drop across load resistors 103.

Each tail current of high-frequency circuit 110 is split into two parts, a fixed part through current sources 115 (i.e., 0.5*$I_1$-$I_{FB2\_B}$ through each of current sources 115) and a programmable part from DAC 515, namely current $I_{FB2\_B}$. Because $I_{FB2\_B}$ current has the inverse relationship of $I_{FB2}$ current, while $I_{FB2}$ current increases with increasing DAC code values provided via encoded signal 514, $I_{FB2\_B}$ current correspondingly decreases, such as decreases from a DAC's scale value, with increasing code.

With this configuration, an output common-mode voltage of high-frequency circuit 110 may be held constant with an increasing peaking function, namely with increasing $I_{FB2}$ current. To clarify, as $I_{FB2}$ current is increased, the amount of current subtracted from each tail current source 115 decreases as $I_{FB2\_B}$ decreases. Effectively, addition of common mode control circuit 525 with an RC feedback or summing circuit provides a common mode control loop. This allows for more tail current to compensate for variation in voltage drop across load resistors, which in turn allows for an output common-mode voltage of high-frequency circuit 110 to be held with less variation, namely to be held more constant.

Peaking control via DAC 515 offers more programmability in terms of resolution and range as compared to a degeneration resistance circuit. Degeneration resistance circuits, where composed of an array of resistor units, are conventionally more quantized than a DAC in terms of number of branches, which affects resolution. Use of a DAC allows scalability, as a DAC conventionally has a larger range than a degeneration resistor implemented with an array.

Figure 6:
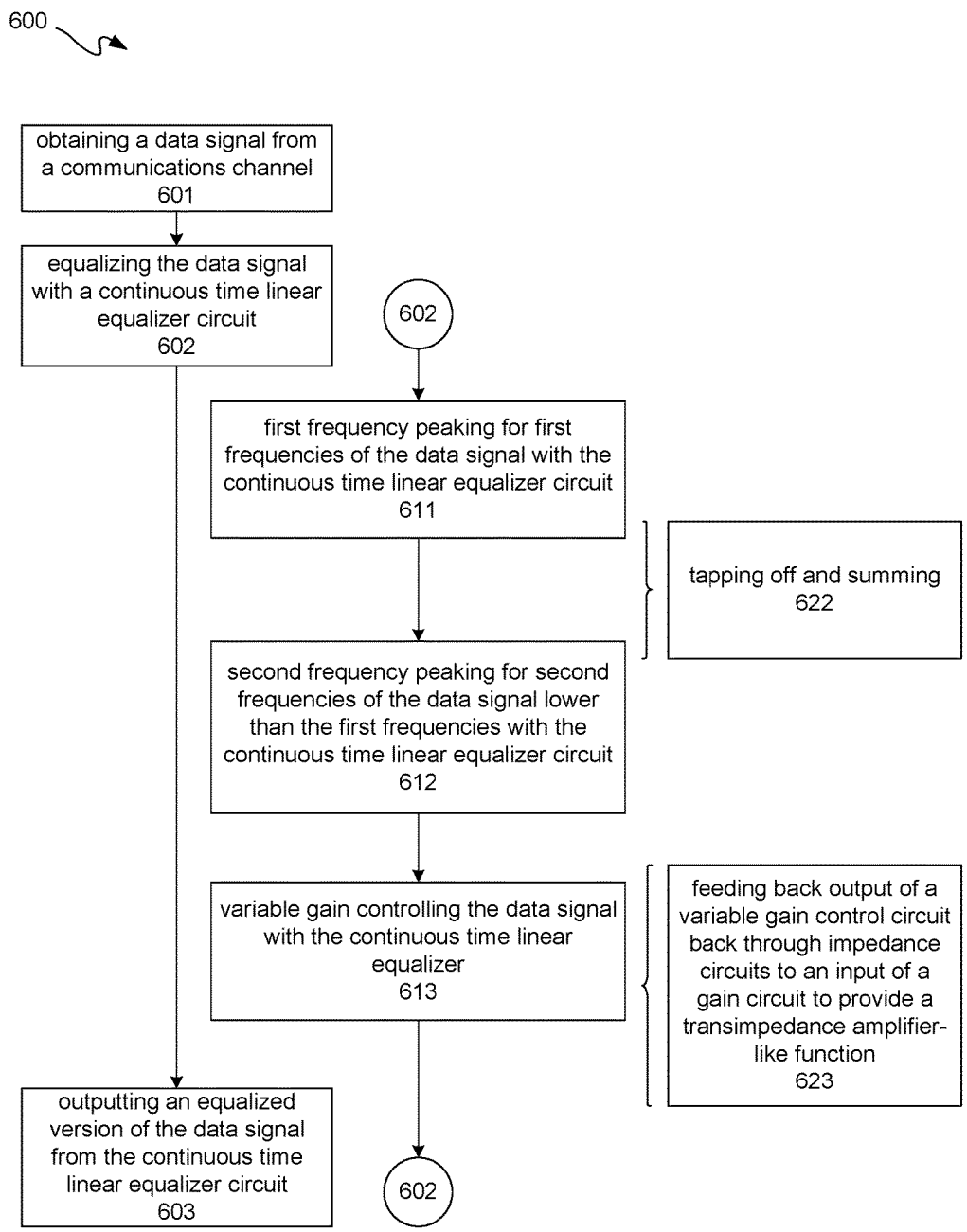
FIG. 6 is a flow diagram depicting an exemplary equalization flow.

FIG. 6 is a flow diagram depicting an exemplary equalization flow 600. Equalization flow 600 is described further with simultaneous reference to FIGS. 1-6.

At 601, a data signal is obtained from a communications channel. At 602, such data signal is equalized with a CTLE, such as CTLE 100, 200, 300, 400, or 500 respectively of FIGS. 1-5. Such equalization at 602 may include operations 611-613.

At 611, first frequency peaking for first frequencies of a data signal is performed with a first-frequency peaking circuit of CTLE 100, 200, 300, 400, or 500. At 612, second frequency peaking for second frequencies of such a data signal is performed with a second-frequency peaking circuit of such a CTLE, such as CTLE 100, 200, 300, 400, or 500, where such second frequencies may be higher, lower or equal to, such first frequencies. For example, such second frequencies may be either lower than such first frequencies or greater than or equal to such first frequencies. Interchangeability, such as described previously, is again noted in the context of operations 611, 612 and 613. Moreover, as previously described, tapping off and summing may be at a same point or points, between operations 611 and 612, as generally indicated by operation 622.

After first- and second-frequency peaking respectively at 611 and 612, at 613 variable gain controlling such a data signal is performed with a variable gain control circuit of such a CTLE, such as CTLE 100, 200, 300, 400, or 500. Such variable gain controlling may include at 623 feeding back output of such a variable gain control circuit back through impedance circuits to an output of such first (or second) frequency peaking circuit connected to an input of such variable gain control circuit to provide a transimpedance amplifier-like function, as previously described. At 603, an equalized version of such data signal may be output from such a CTLE, such as CTLE 100, 200, 300, 400, or 500.

Figure 7:
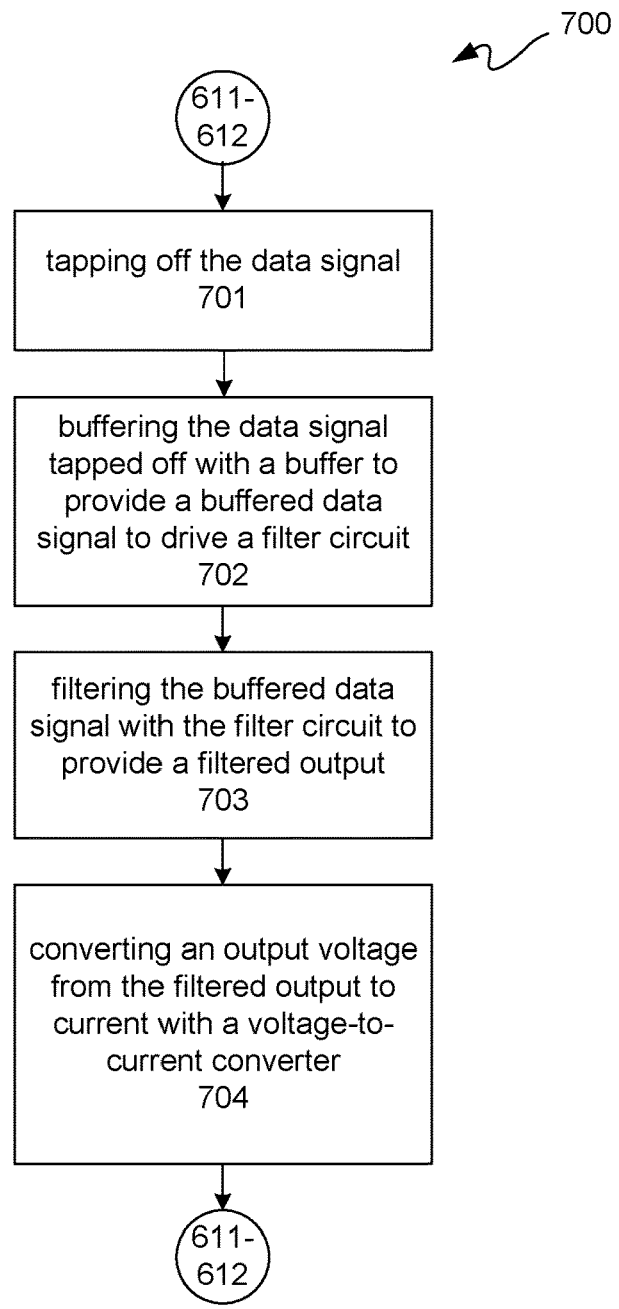
FIG. 7 is a flow diagram depicting an exemplary feedback flow.

FIG. 7 is a flow diagram depicting an exemplary feedback flow 700. Feedback flow 700 is described with simultaneous reference to CTLEs 300, 400, or 500 of FIGS. 3-5. Feedback flow 700 may, though need not be, used with operation 623 of FIG. 6, but otherwise is used with operations of equalization flow 600 of FIG. 6, such as between operations 611 and 612, as generally indicated, including without limitation tapping off and summing operation 622.

At 701, a data signal may be tapped off from an output of a high-frequency peaking circuit of a CTLE 300, 400, or 500. At 702, such data signal tapped off may be buffered with a buffer to provide a buffered data signal to drive a filter circuit, both such buffer and filter circuits are of an RC feedback circuit.

At 703, such buffered data signal may be filtered with such a filter circuit to provide a filtered output therefrom. At 704, an output voltage from such filtered output may be converted to current with a voltage-to-current converter connected to an output of such high-frequency peaking circuit, namely connected to receive a data signal tapped off at 701.

Figure 8:
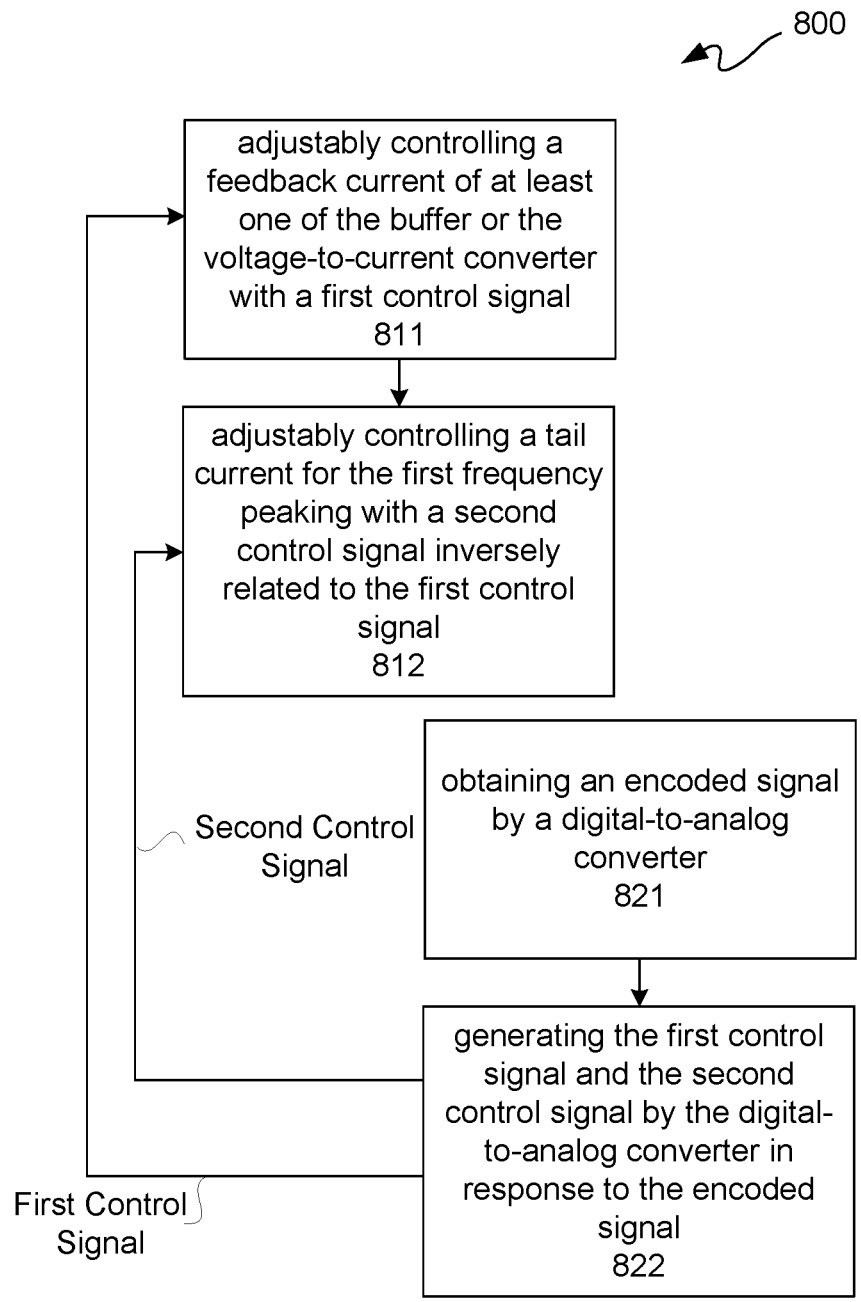
FIG. 8 is a flow diagram depicting an exemplary common-mode control flow.

FIG. 8 is a flow diagram depicting an exemplary common-mode control flow 800. Common-mode control flow 800 is described with simultaneous reference to CTLEs 300, 400, or 500 respectively of FIGS. 3-5. Common-mode control flow 800 may, though need not be, used with operation feedback flow 700 of FIG. 7.

At 811, a feedback current of a current source of at least one a buffer or a voltage-to-current converter is adjusted or adjustably controlled with a first control signal provided from a DAC, such as PMOS DAC 515 for example. At 812, a tail current of a high-frequency peaking circuit of such a CTLE 300, 400, or 500 is adjusted or adjustably controlled with a second control signal provided from such DAC. As previously described, such first control signal and second control signal are complements or inverses of one another.

Optionally, a DAC may obtain an encoded signal at 821. At 822, such DAC in response to such obtained encoded signal, may generate a first control signal for operation 811 and a second control signal for operation 812.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 9:
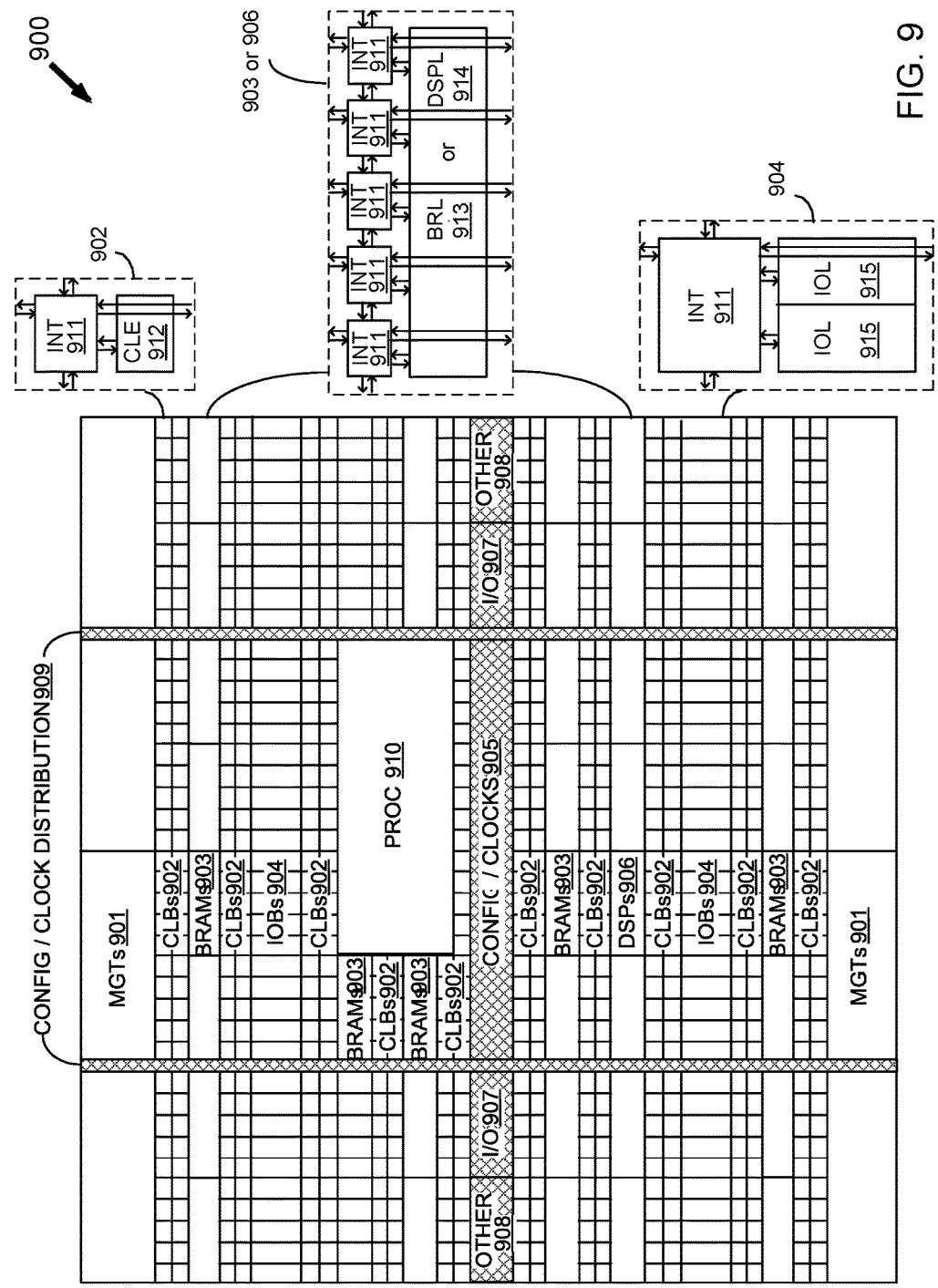
FIG. 9 is a simplified block diagram depicting an exemplary columnar Field Programmable Gate Array ("FPGA") architecture.

As noted above, advanced FPGAs can include several different types of programmable logic blocks in the array. For example, FIG. 9 illustrates an FPGA architecture 900 that includes a large number of different programmable tiles including multi-gigabit transceivers ("MGTs") 901, configurable logic blocks ("CLBs") 902, random access memory blocks ("BRAMs") 903, input/output blocks ("IOBs") 904, configuration and clocking logic ("CONFIG/CLOCKS") 905, digital signal processing blocks ("DSPs") 906, specialized input/output blocks ("I/O") 907 (e.g., configuration ports and clock ports), and other programmable logic 908 such as digital clock managers, analog-to-digital converters, system monitoring logic, and so forth. Some FPGAs also include dedicated processor blocks ("PROC") 910.

In some FPGAs, each programmable tile includes a programmable interconnect element ("INT") 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 can include a configurable logic element ("CLE") 912 that can be programmed to implement user logic plus a single programmable interconnect element ("INT") 911. A BRAM 903 can include a BRAM logic element ("BRL") 913 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element ("DSPL") 914 in addition to an appropriate number of programmable interconnect elements. An IOB 904 can include, for example, two instances of an input/output logic element ("IOL") 915 in addition to one instance of the programmable interconnect element 911. As will be clear to those of skill in the art, the actual I/O pads connected, for example, to the I/O logic element 915 typically are not confined to the area of the input/output logic element 915.

In the pictured embodiment, a horizontal area near the center of the die (shown in FIG. 9) is used for configuration, clock, and other control logic. Vertical columns 909 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, processor block 910 spans several columns of CLBs and BRAMs.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A continuous time linear equalizer, comprising:
   a variable gain circuit, the variable gain circuit comprising:
      a first transistor and a second transistor each having a gate node respectively configured as a first input node and a second input node of the variable gain circuit, the first transistor and the second transistor each having a drain node respectively configured as a first output node and a second output node of the variable gain circuit;
      a first transimpedance circuit connected between the first input node and the second output node of the variable gain circuit;
      a second transimpedance circuit connected between the second input node and the first output node of the variable gain circuit; and
      a source node of each of the first transistor and the second transistor commonly connected to one another.

2. The continuous time linear equalizer according to claim 1, further comprising:
   a first load circuit and a second load circuit commonly connected to a supply node and respectively connected to the first transimpedance circuit and the second transimpedance circuit;

a current source circuit connected between the source node and a ground node; and wherein the first transimpedance circuit and the second transimpedance circuit are respectively configured to provide a first transimpedance and a second transimpedance to provide a transimpedance amplifier-like function for a variable gain function of the variable gain circuit.

3. The continuous time linear equalizer according to claim 1, further comprising a voltage-to-current converter circuit having output nodes respectively connected to the first input node and the second input node of the variable gain circuit.

4. The continuous time linear equalizer according to claim 3, wherein the variable gain circuit and the voltage-to-current converter circuit are respectively configured as a first current-mode logic buffer and a second current-mode logic buffer with the first transimpedance circuit and the second transimpedance circuit connected to provide feedback from the first current-mode logic buffer back to the second current-mode logic buffer.

5. The continuous time linear equalizer according to claim 4, further comprising:
  a resistor-capacitor ("RC") feedback circuit configured with combined tap-off and summing nodes respectively in common with input nodes of the voltage-to-current converter circuit; and
  wherein the first transimpedance circuit and the second transimpedance circuit respectively include a first resistance circuit and a second resistance circuit respectively configured to provide a first adjustable impedance and a second adjustable impedance.

6. A continuous time linear equalizer, comprising:
  a first frequency peaking circuit and a second frequency peaking circuit;
  output nodes of the first frequency peaking circuit connected to input nodes of the second frequency peaking circuit; and
  the second frequency peaking circuit including:
    a voltage-to-current converter circuit having the input nodes; and
    a resistor-capacitor ("RC") feedback circuit configured with combined tap-off and summing nodes respectively in common with the output nodes of the first frequency peaking circuit and the input nodes of the voltage-to-current converter circuit.

7. The continuous time linear equalizer according to claim 6, wherein the voltage-to-current converter circuit is a first voltage-to-current converter circuit having a differential pair of transistors with commonly connected source nodes and respective gate nodes as the input nodes of the first voltage-to-current converter circuit, and wherein the RC feedback circuit comprises:
  a buffer circuit having gate nodes respectively connected to the output nodes of the first frequency peaking circuit;
  a filter circuit connected to drain nodes of the buffer circuit; and
  a second voltage-to-current converter circuit connected to filter nodes of the filter circuit, the second voltage-to-current converter circuit having drain nodes respectively connected to the output nodes of the first frequency peaking circuit.

8. The continuous time linear equalizer according to claim 7, wherein:
  the buffer circuit is configured as a first current-mode logic buffer circuit; and
  the second voltage-to-current converter circuit is configured as a second current-mode logic buffer circuit.

9. The continuous time linear equalizer according to claim 6, wherein the second frequency peaking circuit comprises a variable gain control circuit connected to output nodes of the voltage-to-current converter circuit.

10. The continuous time linear equalizer according to claim 9, wherein the variable gain control circuit comprises:
  a first transimpedance circuit and a second transimpedance circuit respectively connected between the output nodes of the voltage-to-current converter circuit and output nodes of the variable gain control circuit to provide feedback for the second frequency peaking circuit; and
  source nodes of the variable gain control circuit commonly connected to one another.

11. The continuous time linear equalizer according to claim 6, further comprising:
  a digital-to-analog converter connected to provide a first control signal and a second control signal respectively to an adjustable current source of each of the first frequency peaking circuit and the RC feedback circuit; and
  wherein the second control signal is an inverse of the first control signal.

12. The continuous time linear equalizer according to claim 11, wherein the voltage-to-current converter circuit is a first voltage-to-current converter circuit having a differential pair of transistors with commonly connected source nodes and respective gate nodes as the input nodes of the first voltage-to-current converter circuit, and wherein the RC feedback circuit comprises:
  a buffer circuit having gate nodes respectively connected to the output nodes of the first frequency peaking circuit;
  a filter circuit connected to drain nodes of the buffer circuit;
  a second voltage-to-current converter circuit connected to filter nodes of the filter circuit, the second voltage-to-current converter circuit having drain nodes respectively connected to the output nodes of the first frequency peaking circuit; and
  the second voltage-to-current converter circuit including the adjustable current source of the RC feedback circuit.

13. The continuous time linear equalizer according to claim 11, wherein the voltage-to-current converter circuit is a first voltage-to-current converter circuit having a differential pair of transistors with commonly connected source nodes and respective gate nodes as the input nodes of the first voltage-to-current converter circuit, and wherein the RC feedback circuit comprises:
  a buffer circuit having gate nodes respectively connected to the output nodes of the first frequency peaking circuit;
  a filter circuit connected to drain nodes of the buffer circuit;
  a second voltage-to-current converter circuit connected to filter nodes of the filter circuit, the second voltage-to-current converter circuit having drain nodes respectively connected to the output nodes of the first frequency peaking circuit; and
  the buffer circuit including the adjustable current source of the RC feedback circuit.

14. The continuous time linear equalizer according to claim 11, wherein:

the first frequency peaking circuit is for first frequencies; and the second frequency peaking circuit is for second frequencies either less than the first frequencies or greater than or equal to the first frequencies.

15. A method for continuous time linear equalization, comprising:
   obtaining a data signal from a communications channel;
   equalizing the data signal with a continuous time linear equalizer circuit, the equalizing with the continuous time linear equalizer circuit comprising:
      providing first frequency peaking for first frequencies of the data signal;
      providing second frequency peaking for second frequencies of the data signal higher than, lower than or equal to the first frequencies; and
      providing variable gain control of the data signal, comprising:
         feeding back output of a variable gain control circuit back through impedance circuits to an input of a gain circuit to provide a transimpedance amplifier-like function; and
   outputting an equalized version of the data signal from the continuous time linear equalizer circuit.

16. The method according to claim 15, further comprising:
   tapping off the data signal after the first frequency peaking and before the second frequency peaking;
   buffering the data signal tapped off with a buffer to provide a buffered data signal to drive a filter circuit;
   filtering the buffered data signal with the filter circuit to provide a filtered output; and
   converting an output voltage from the filtered output to current with a voltage-to-current converter connected to receive the data signal after the first frequency peaking and before the second frequency peaking.

17. The method according to claim 16, further comprising adjusting a feedback current of at least one of the buffer or the voltage-to-current converter with a control signal.

18. The method according to claim 17, further comprising:
   obtaining an encoded signal by a digital-to-analog converter; and
   generating the control signal by the digital-to-analog converter in response to the encoded signal.

19. The method according to claim 16, further comprising:
   adjusting a feedback current of at least one of the buffer or the voltage-to-current converter with a first control signal; and
   adjusting a tail current for the first frequency peaking with a second control signal inversely related to the first control signal.

20. The method according to claim 19, further comprising:
   obtaining an encoded signal by a digital-to-analog converter; and
   generating the first control signal and the second control signal by the digital-to-analog converter in response to the encoded signal.

* * * * *